United States Patent [19]

Critchlow et al.

[11] Patent Number: 4,873,205
[45] Date of Patent: Oct. 10, 1989

[54] METHOD FOR PROVIDING SILICIDE BRIDGE CONTACT BETWEEN SILICON REGIONS SEPARATED BY A THIN DIELECTRIC

[75] Inventors: Dale L. Critchlow, Burlington; John K. DeBrosse, Essex Junction; Rick L. Mohler, Williston; Wendell P. Noble, Jr., Milton; Paul C. Parries, Essex Junction, all of Vt.

[73] Assignee: International Business Machines Corporation, Armonk, N.Y.

[21] Appl. No.: 240,421

[22] Filed: Sep. 1, 1988

Related U.S. Application Data

[63] Continuation of Ser. No. 135,953, Dec. 21, 1987, abandoned.

[51] Int. Cl.[4] .................. H01L 21/205; H01L 21/283; H01L 21/314
[52] U.S. Cl. .................................. 437/200; 437/201; 437/192; 437/90; 437/83; 437/60; 437/52; 437/967; 437/968; 148/DIG. 25; 148/DIG. 26; 156/612; 357/236; 357/67
[58] Field of Search ................. 437/52, 60, 192, 967, 437/968, 200, 201, 83, 90; 148/DIG. 25, DIG. 26; 357/23.6, 67; 156/644, 612

[56] References Cited

U.S. PATENT DOCUMENTS

| | | | |
|---|---|---|---|
| 3,375,418 | 3/1968 | Garnache et al. | 357/15 |
| 3,753,774 | 8/1973 | Velolic | 437/192 |
| 4,333,099 | 6/1982 | Tanguay et al. | 437/201 |
| 4,374,700 | 2/1983 | Scott et al. | 156/656 |
| 4,458,410 | 7/1984 | Sujaki et al. | 437/201 |
| 4,522,662 | 6/1985 | Bradbury et al. | 148/DIG. 26 |
| 4,578,142 | 3/1986 | Corboy, Jr. et al. | 156/612 |
| 4,579,621 | 4/1986 | Hine | 156/646 |
| 4,592,792 | 6/1986 | Corboy, Jr. et al. | 148/DIG. 26 |
| 4,612,072 | 9/1986 | Morrison et al. | 148/DIG. 26 |
| 4,663,191 | 5/1987 | Choi et al. | 437/202 |
| 4,688,063 | 8/1987 | Lu et al. | 357/23.6 |
| 4,737,828 | 4/1988 | Brown | 357/23.1 |
| 4,745,081 | 5/1988 | Beyer et al. | 437/38 |

FOREIGN PATENT DOCUMENTS 0128304 12/1984 European Pat. Off.
0221394 5/1987 European Pat. Off.
0264692 4/1988 European Pat. Off.

OTHER PUBLICATIONS

Jastrzebski et al., "Growth Process of Silicon Over $SiO_2$ by CVD" *J. Electrochem. Soc.*, vol. 130, No. 7, Jul. 1983, pp. 1571-1580.

Rathman et al., "Lateral Epitaxial Overgrowth of Silicon on $SiO_2$", *J. Electrochem. Soc.*, vol. 129, No. 10, Oct. 1982, pp. 2303-2306.

Mouchan et al., "Structure and Properties of Thick Vacuum Condensates"... *Fiz. Metal. Metalloued*, 28, No. 4, 1969, pp. 83-90.

Choi et al., "CMOS Process for Titanium Salicide Bridging", *IBM Tech. Dis. Bull.*, vol. 29, No. 3, Aug. 1986, pp. 1037-1038.

P. J. Tsuang, "Forming Thick Metal Silicide for Contact Barrier," *IBM Technical Disclosure Bulletin*, vol. 19, No. 9, Feb. 1977, pp. 3383-3385.

T. M. Reith et al., "Controlled Ohmic Contact and Planarization for Very Shallow Junction Structures," *IBM Technical Disclosure Bulletin*, vol. 20, No. 9, Feb. 1978, pp. 3480-3483.

*IBM Tech. Disc. Bull.*, vol. 28, No. 6, Nov. 1985, pp. 2335-2336.

Zingg et al., *J. Electrochem. Soc.*, vol. 133, No. 6, Jun. 1986, pp. 1274-1275.

*Primary Examiner*—Olik Chaudhuri
*Assistant Examiner*—T. N. Quach
*Attorney, Agent, or Firm*—William D. Sabo; Mark F. Chadurjian

[57] ABSTRACT

A method for forming a silicide bridge between a diffusion region and an adjacent poly-filled trench separated by a thin dielectric. Silicon is selectively grown over exposed silicon regions under conditions that provide controlled lateral growth over the thin dielectric without also permitting lateral growth over other insulator regions. A refractory metal layer is then deposited and sintered under conditions that limit lateral silicide growth, forming the bridge. This process avoids the random fails produced by previous processes while enhancing the compatibility of bridge formation with shallow junctions, without introducing extra masking steps or other process complexities.

17 Claims, 2 Drawing Sheets

METHOD FOR PROVIDING SILICIDE BRIDGE CONTACT BETWEEN SILICON REGIONS SEPARATED BY A THIN DIELECTRIC

This is a continuation of co-pending application Ser. No. 135,953, filed on Dec. 21, 1987, now abandoned.

CROSS-REFERENCE TO RELATED APPLICATIONS

Reference is made to co-pending U.S. patent application Ser. No. 793,518, now U.S. Pat. No. 4,745,081, entitled "Undoped and Doped Silicon Trench Fill," filed Oct. 30, 1985 by K. D. Beyer et al and assigned to the assignee of the present invention. This application relates to a method of providing both isolation trenches and substrate contacts during the course of the same trench formation process. The application teaches the general idea of growing doped silicon within a partially-filled trench as well as on an adjacent region of the silicon substrate to form a bridge contact over the dielectric therebetween.

Reference is also made to co-pending U.S. patent application Ser. No. 920,471, entitled "Silicide Bridge Contact," filed Oct. 20, 1986 by N. C. C. Lu et al and assigned to the assignee of the present invention. The application relates to a method of providing a bridge contact by forming a refractory metal under high temperature conditions that provide a columnar metal grain structure. This grain structure enhances the rate of formation of refractory metal silicide over that of refractory metal nitride when the metal is subsequently sintered in a nitrogen-based ambient to form a silicide, such that bridging is promoted over dielectric regions having small lateral lengths without promoting bridging over dielectric regions having longer lateral lengths.

TECHNICAL FIELD

The invention relates to a method of providing a bridge contact that electrically interconnects silicon-based conductive regions.

BACKGROUND ART

Refractory metals and refractory metal silicides have become the material of choice for interconnecting large numbers of conductive structures. These materials possess low resistivity characteristics normally associated with metals such as aluminum or copper, without providing the manufacturing challenges inherent in these materials (heat sensitivity in the case of aluminum, patterning difficulties in the case of copper). In the prior art, it is generally known to form silicide electrodes on silicon diffusion regions by depositing the refractory metal layer on the substrate, heating the metal to form silicide regions over the exposed silicon regions, and treating the substrate in a wet etchant to remove the unreacted refractory metal.

The above method presents difficulties when adopted for use in shallow junction technologies. The phrase "shallow junctions" or "shallow diffusions" refers to diffusion regions that extend a very small distance (i.e., less than 0.5 microns) into the surface of the silicon substrate. These shallow junction regions make the resulting device characteristics less susceptible to variation due to shorter channel lengths. The above-described silicide forming method may consume up to several tenths of a micron of the underlaying silicon in forming the silicide. This consumption has the effect of greatly reducing the effective dopant concentration at the silicide/diffusion interface, resulting in an increase in the extrinsic resistance of the source/drain electrodes, and in extreme cases could degrade the diode character of the junctions. This in turn reduces the switching speed of the device.

Several solutions have been suggested to remedy this problem. One method is to co-deposit the refractory metal with silicon, such that upon annealing a lesser amount of the junction silicon will be consumed. See for example U.S. Pat. No. 4,663,191, entitled "Salicide Process For Forming Low Sheet Resistance Doped Silicon Junctions," issued 5/5/87 to Choi et al and assigned to the assignee of the invention. Another technique is to provide additional silicon on top of the junction regions. In an article by Reith et al, entitled "Controlled Ohmic Contact and Planarization For Very Shallow Junction Structures," IBM Technical Disclosure Bulletin, Vol. 20, No. 9, February 1978, pp. 3480–3483, silicon added to an aluminum deposition diffuses to the surface of an exposed dopant region. After the aluminum is removed, platinum is deposited and sintered to form platinum silicide. During the sintering cycle, all of the deposited silicon is consumed to prevent consumption of the underlaying shallow junction region. In U.S. Pat. No. 3,375,418, entitled "S-M-S Device With Partial Semiconducting Layers," a thin layer of doped epitaxial silicon is formed over an exposed portion of a silicon substrate by silicon reduction of SiCl4 in H2 at 1200° C. MoSi2 is subsequently deposited over the entire structure, to contact the underlaying silicon through the doped epitaxy. In U.S. Pat. No. 3,753,774, entitled "Method For Making An Intermetallic Contact To A Semiconductor Device," doped silicon is deposited over exposed silicon regions, and platinum is then deposited and sintered to form a platinum silicide contact. In an article by Tsang entitled "Forming Thick Metal Silicide For Contact Barrier," IBM Technical Disclosure Bulletin, Vol. 19, No. 9, February 1977, pp. 3383–3385, a blanket layer of silicon is deposited over a masked substrate, and the silicon is removed from all areas except over the portion of the substrate exposed through the mask. Then a blanket layer of refractory metal is deposited and sintered, such that a silicide is formed over the exposed silicon region.

In the present invention, the goal is to provide an electrically conducting bridge contact between silicon regions laterally separated by a narrow dielectric without providing such a contact between regions laterally separated by a wider dielectric. A specific application of such a process is to form a bridge contact between a polysilicon-filled trench and an adjacent silicon diffusion region, without also bridging to other silicon regions such as the exposed surface of a gate electrode. The general memory cell structure upon which such a process is carried out is shown and described in U.S. Pat. No. 4,688,063, entitled "Dynamic RAM Cell With MOS Trench Capacitor in CMOS." In this patent, the connection between the poly-filled trench and the source diffusion of the adjacent transfer gate FET is formed by depositing and etching a conductive polysilicon layer that bridges over the dielectric separating the two regions. In the above-cited co-pending U.S. co-pending U.S. patent application Ser. No. 793,518, this contact is formed by growing highly doped selective silicon over the two regions. In the above-cited U.S. patent application Ser. No. 920,471, this contact is formed by a silicide in which the refractory metal is deposited under high temperature conditions to provide a columnar grain structure that promotes selective silicide formation. In an article by Choi et al, entitled "CMOS Process For Titanium Salicide Bridging Of A Trench And Simultaneously Allowing For True Gate Isolation," IBM Technical Disclosure Bulletin, Vol. 29, No. 3, August 1986 pp. 1037-1038, a layer of refractory metal is deposited over the entire substrate. Since during the course of deposition the refractory metal is thinner over the gate sidewalls than it is over the remaining portions of the substrate, a subsequent isotropic etch can remove the refractory metal from the gate sidewalls to prevent undesired bridging during a subsequent sintering cycle that forms the desired bridge contact. See also U.S. Pat. No. 4,333,099 (a layer of polysilicon is deposited over a substrate having differentially-doped regions separated by a dielectric, and refractory metal ions are implanted and sintered to form a silicide at that portion of the poly line that provides a P-N junction) and U.S. Pat. No. 4,374,700 (a laterally-extending notch is formed in a dielectric that vertically separates a gate-level interconnecting poly from a diffused region, and a layer of poly is deposited and etched to fill the groove and thus provide a source of silicon during a subsequent refractory metal deposit/sinter cycle that forms a silicide interconnecting the two regions).

Several difficulties are presented by the above art. If a layer of polysilicon is used to form the bridge contact, an additional masking step is required for definition. Since each masking step materially adds to the total cost of the fabrication process, this additional masking step is to be avoided. Moreover, the attendant alignment requirements would materially increase the area required to build the cell. If doped selective silicon is used, the dopant may diffuse out of the silicon bridge to alter the conductivity characteristics of the underlaying silicon regions. This is a particularly egregious concern when applied to differentially doped diffusion regions. If reliance is placed on the thickness of the refractory metal as-deposited, differences in thickness will result in undesired bridging. Finally, it has been found that when the refractory metal is simply deposited and sintered, silicon will up diffuse and be consumed during the silicide reaction. As a result, the upper surface of the resulting silicide will sink below the level of the refractory metal as-deposited. While in ordinary applications this "thinning" is not a problem, in the bridge contact application of the invention it results in random bridge contact fails across the wafer.

Accordingly, there is a need in the art for a bridge-forming process that avoids the problems associated with the above-described methods.

SUMMARY OF THE INVENTION

The method of the invention is carried out on a silicon substrate that has exposed silicon regions thereon, at least some of the regions comprising diffusion regions. Some of the exposed silicon regions are separated by narrow insulator gaps, and remaining ones of the exposed silicon regions are separated by insulator gaps that are wider than the narrow insulator gaps. Undoped silicon regions are then selectively grown on the exposed silicon regions without appreciably varying the dopant profiles of the diffusion regions, by exposure to a silicon-based gas and an etchant gas, the two gases being present at a ratio sufficient to allow silicon to be formed over the narrow insulator gaps without allowing silicon to be formed over the wider insulator gaps. Then a refractory metal is deposited under conditions promoting step coverage, and is sintered to provide silicide regions over all of the exposed silicon regions without consuming an appreciable amount of the exposed silicon regions. The silicon laterally grown over the narrow insulator gap provides silicon for the bridge contact formed thereon.

BRIEF DESCRIPTION OF THE DRAWING

The above and other features of the invention will become more apparent upon a review of the following description of the best mode for carrying out the invention. In the description to follow, reference will be made to the accompanying drawings in which.

DESCRIPTION OF THE BEST MODE FOR CARRYING OUT THE INVENTION

Figure 1:
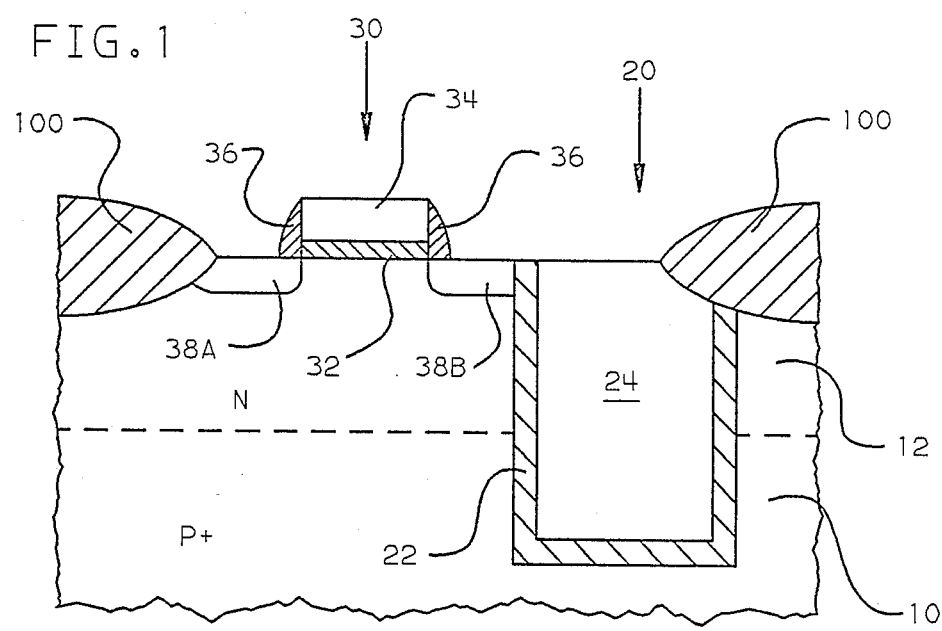
FIG. 1 is a cross-sectional view of a processed semiconductor substrate upon which the method of the invention is practiced.

FIG. 1 shows a processed semiconductor substrate upon which the method of the invention is practiced. More specifically, a memory cell cell comprising a transfer gate FET 30 and a trench storage capacitor 20 isolated from adjacent cells by semi-recessed oxidation regions (SROX) 100 is shown. In general, the structure shown in FIG. 1 is the same as that described in the above-mentioned U.S. Pat. No. 4,688,063, the teachings of which are completely incorporated herein by reference. The trench storage capacitor 20 is defined by a trench that extends through the N well 12 into the underlaying P+ monocrystalline silicon substrate 10. The sidewalls of the trench 20 are coated with layers of silicon oxide, silicon nitride, and silicon oxide to provide a trench dielectric 22 that separates the p-doped polycrystalline silicon fill 24 from the remainder of the substrate. The transfer gate FET 30 includes p-type source and drain regions 38B, 38A, and a gate electrode defined by an n-type polysilicon layer 34 having oxide spacers 36 disposed on its sidewalls and an underlaying dielectric 32 that provides insulation from the underlaying channel region between the source and drain diffusions. The depicted memory cell is based in CMOS technology (i.e., while only a p-type FET is shown, in the support circuits of the memory array both p and n channel transistors are used).

There are several differences between the processed substrate shown in FIG. 1 of the present application and the structure shown in U.S. Pat. No. 4,688,063. In the present invention, the SROX region 100 adjacent to the trench capacitor partially overlays the filled trench; in the '063 patent, the isolation region does not overlap onto the filled trench. Moreover, in the present invention sidewall spacers 36 are defined on the sidewalls of the gate electrode to provide spacing during the subsequent source/drain implant and drive-in; in the '063 patent, sidewall spacers are not used. Finally, in the present invention both the gate electrode and the source/drain regions are completely formed prior to the formation of the selective bridge; in the '063 patent, the bridge is defined by deposition and etching of a doped polysilicon region (the source region being partially formed by outdiffusion from the doped poly), which is covered by an oxide layer prior to formation of the transfer gate FET.

Of the above distinctions, the latter two are significant. The sidewall spacers 36 form a dielectric that will prevent silicide formation on the gate sidewalls during formation of the bridge contact. Moreover, by first forming the source/drain regions, constraints are placed on the process for forming the bridge contact. In general, the process for forming the spacers and the source/drain regions is as follows. After the gate polysilicon is defined, a first layer of conformal oxide is deposited thereon, and the source/drain regions of the p and n channel devices are defined by respective implantations through respective masks. The first oxide layer protects both the gate polysilicon and the silicon substrate from damage during implantation. Then, a second layer of conformal oxide is deposited on the first, and the two conformal oxides are etched in a $CF_4+O_2$ plasma under high energy conditions so that the layers are substantially removed from horizontal surfaces without being removed from vertical surfaces such as the sidewalls of the gate polysilicon.

The present invention relates to a method of forming a bridge contact between the polysilicon trench fill 24 and the diffusion region 38B of the adjacent FET device. These two regions are separated by dielectric 22, which is approximately 15–20 nm in thickness. In forming the desired bridge contact, undesired bridge contacts could form between the source/drain regions and the top of the gate polysilicon 34. The gate polysilicon 34 is 300 nm thick. In other words, the bridge should be formed over the 15–20 nm insulator gap without forming over the 300 nm insulator gap between the surface of the source/drain regions and the exposed surface of the gate polysilicon. For ease of description, these horizontal/vertical insulator spacings between silicon regions as defined by the lateral length and/or thickness of intervening insulators shall be referred to as "insulator gaps."

Figure 2:
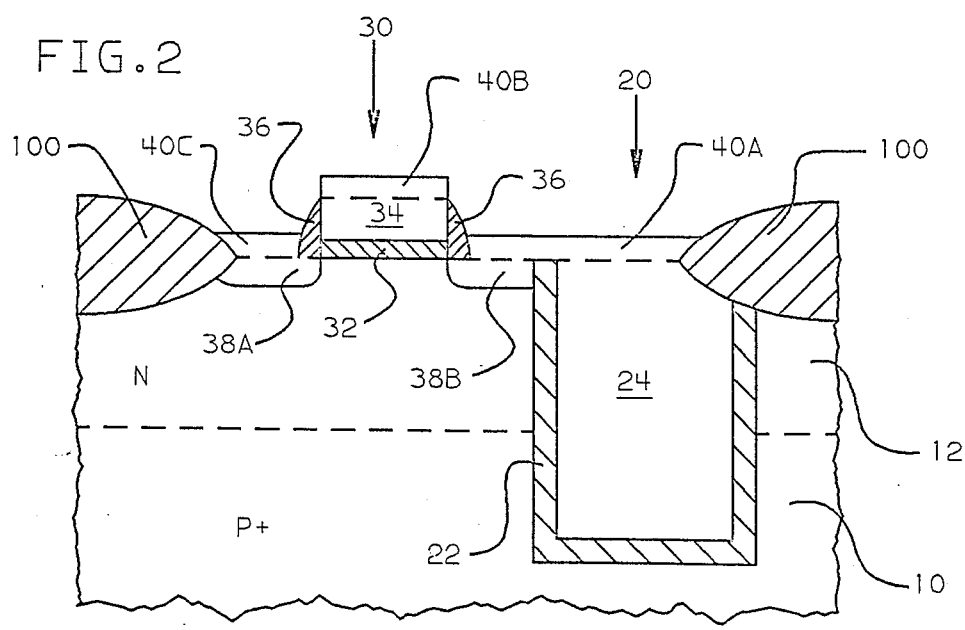
FIG. 2 is a cross-sectional view of the substrate of FIG. 1 after selective silicon growth.
Figure 3:
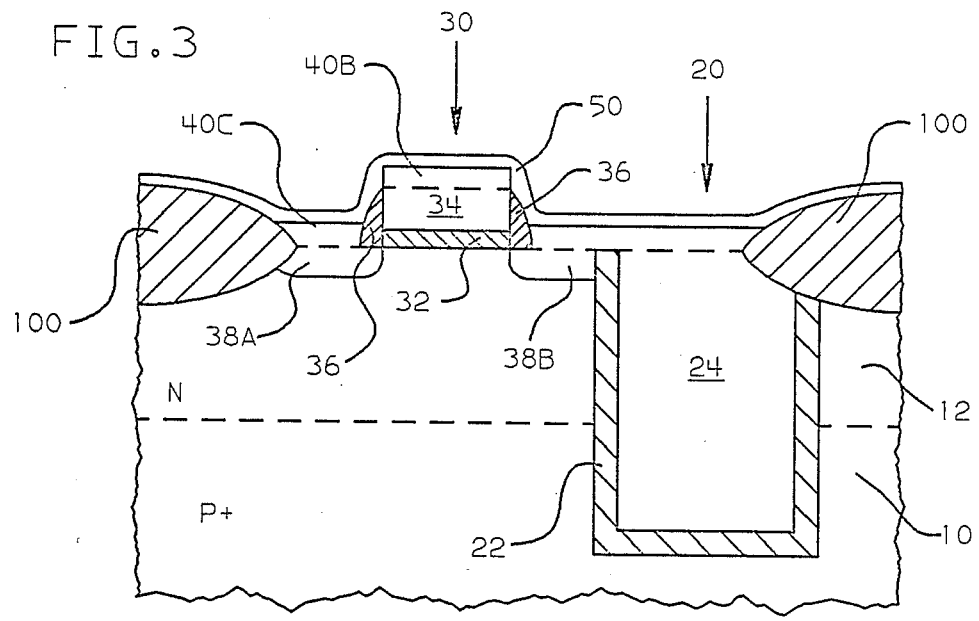
FIG. 3 is a cross-sectional view of the substrate of FIG. 2 after deposition of a layer of refractory metal.
Figure 4:
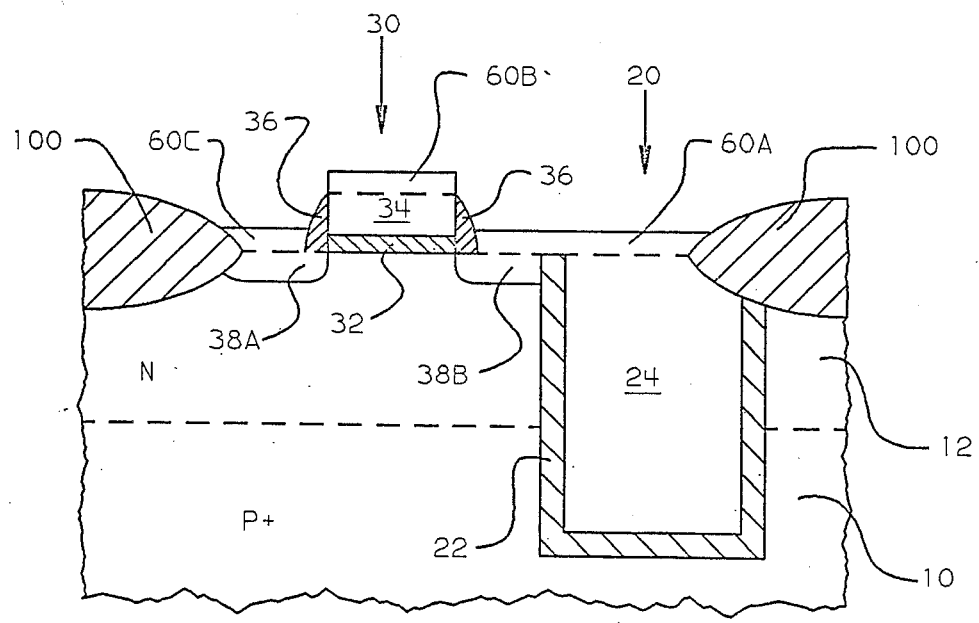
FIG. 4 is a cross-sectional view of the substrate of FIG. 3 after sintering to form the silicide and removal of the unreacted refractory metal.

With reference to FIGS. 2–4, the process of the invention will now be described. As shown in FIG. 2, the exposed silicon regions are covered by a layer of selectively grown silicon. Selective silicon region 40C is formed on top of diffusion region 38A, and selective silicon region 40B is formed on top of gate polysilicon 34. Note that selective silicon region 40A spans the dielectric 22 between the diffusion region 38B and the polysilicon fill 24. That is, the conditions under which the selective silicon is grown are controlled so that the silicon laterally grows over narrow insulator gaps (e.g. over dielectric 22) without growing over wider insulator gaps (e.g. over sidewall spacers 36).

The selective silicon is formed by exposure of the substrate to a chlorosilane/etchant deposition gas at low temperature. Chlorosilanes of the general formula $SiH_xCl_y$ provide both selectivity and reasonable reaction rates. Silane by itself would not provide selectivity (i.e., the resulting silicon layer would form over all surfaces of the substrate, including those covered by insulators). In the invention, HCl is added to the ambient to provide several useful properties. HCl lowers the disassociation energy of the silicon in the chlorosilane compound, thus enhancing the reaction rate. HCl also provides a Cl-based etch component that removes deposited silicon from the surface of insulators during the course of the selective silicon deposition. In general, the growth of selective silicon in a silicon gas/HCl ambient is described in U.S. Pat. No. 4,522,792, entitled "CVD Lateral Epitaxial Growth Of Silicon Over Insulators," U.S. Pat. No. 4,578,142, entitled "Method For Growing Monocrystalline Silicon Through Mask Layer," U.S. Pat. No. 4,579,621, entitled "Selective Epitaxial Growth Method," U.S. Pat. No. 4,592,792, entitled "Method For Forming Uniformly Thick Selective Epitaxial Silicon," and the following articles from the Journal of the Electrochemical Society: Rothman et al, "Lateral Epitaxial Overgrowth of Silicon on SiO2'" Vol. 129, No. 10, pp. 2303–2306, Jastrzebski et al, "Growth Process Of Silicon Over SiO2 By CVD: Epitaxial Lateral Overgrowth Technique," Vol. 130, No. 7, pp. 1571–1580, and Zingg et al, "Epitaxial Lateral Overgrowth Of Silicon Over Steps Of Thick SiO2," Vol. 133, No. 6, pp. 1274–1275. The present inventors found that there was a general range of chlorosilane—HCl ratios that provides both selectively and controlled lateral growth. In general, for a $SiH_2Cl_2$ flow of 575 SCCM, the HCl flow should be between 500 and 800 SCCM. If the HCl flow is below approximately 500 SCCM, the Si deposition rate will appreciably increase and selectivity will appreciably degrade. If the HCl flow is above approximately 800 SCCM, silicon growth will be retarded and an insufficient amount of silicon may form over the small insulator gap. In addition, exposed silicon surfaces may be etched. Thus, a dichlorosilane—HCl ratio on the order of approximately 0.7:1 and 1.15:1 will provide sufficient lateral epitaxial growth to span the narrow insulator gap (i.e., dielectric 22) without spanning wider insulator gaps (e.g., spacers 36).

During the deposition phase, the temperature of the ambient must be sufficiently high to allow the silicon to diassociate from the source gases. Epitaxial silicon is commonly grown at temperatures on the order of 1000° C. In the present invention the bridge contact is formed after source/drain implant and drive-in. If the selective silicon were grown at 1000° C., the dopant distribution within the junctions would be altered because the dopant would diffuse downward into the silicon substrate and upward into the grown silicon during deposition (note that there are no dopant sources present in the deposition gas, such that the grown silicon regions are undoped as-deposited. This further prevents alteration of the dopant concentrations within the junctions). Therefore, in the invention the temperature is held within the range of approximately 860° C.–900° C. Moreover, even if the source/drain regions are formed after formation of the bridge contact, low temperature deposition is preferred because there are other shallow diffusion regions (e.g., channel tailor implants) to be protected.

These lower deposition temperatures are made possible by carrying out the deposition at lower pressures. Specifically, the deposition should be carried out at a pressure less than 50 Torr in an oxygen-free environment. It is postulated that if the pressure could be reduced below the current operating point of 40 Torr, the deposition temperature could be lowered still further.

Then, as shown in FIG. 3, a layer of refractory metal is deposited over the substrate. Note that the thickness of the refractory metal should be commensurate with, or slightly greater than, the thickness of the selectively grown silicon regions. This insures that only a small amount of the underlaying silicon regions are consumed during the subsequent anneal cycle that forms the silicide. If the refractory metal is thinner than the epitaxial regions, residual amounts of epitaxial silicon would remain above the silicon regions to substantially increase the resistance of the contacts. In general, while the refractory metal can be deposited using any one of a number of known methods (e.g. chemical vapor deposition, sputtering, etc.) it is preferred to form the refractory metal by evaporation under high temperature conditions that enhance the step coverage of the film. In the above-mentioned U.S. patent application Ser. No. 920,471, the refractory metal was deposited at high temperatures (i.e., 390° C.) to promote the formation of columnar grains having a lateral length commensurate to that of the trench dielectric. In the present invention, the lateral length of the grains is no longer critical, because of the silicon formation over the trench dielectric. However, the inventors have found that the columnar grains enhance the step coverage provided by the film, and as such it is preferred to evaporate the film at substrate temperatures above approximately 300° C.

Finally, the refractory metal is sintered in a nitrogen-based atmosphere that prevents lateral silicide formation, and the unreacted refractory metal is removed by wet etching. See FIG. 4. Because there is silicon available above dielectric 22 between the source diffusion 38B and the polysilicon fill 24, a bridge contact will be formed between these two regions. At the same time, silicide regions 60A, 60B, and 60C are formed over the source region 38B, the gate poly 34, and the drain region 38A, respectively, to provide low resistivity contacts to these regions.

The invention will now be described with reference to the following Example. Prior to processing the substrate of FIG. 1 is first given a brief HF dip to remove native oxides. The substrate is then exposed to an H2 atmosphere at 920° C. for 3 minutes. This cycle removes any native oxides that may have formed on the exposed silicon regions. Then the temperature is reduced to 880° C., and the substrate is exposed to an ambient comprised of 575 SCCM SiH2Cl2, 675 SCCM H2, and 76000 SCCM H2 (a carrier gas that does not chemically contribute to the reaction) for 3 minutes to form selective silicon regions that are approximately 75 nm thick. The temperature is then reduced, and the system is purged using nitrogen. The substrate is exposed to a HF dip etch to remove any oxides, and then 75 nm of titanium is evaporated from dual e-beam sources at a substrate temperature of 390° C. The substrate is then annealed at approximately 700° C. in a 90% N2—10% H2 ambient for 20 minutes to form the silicide regions, and the unreacted titanium is removed by exposure to a 5:1:1 etchant solution of deionized water, NH4OH, and H2O2 that does not appreciably attack the silicide regions.

The process of the invention circumvents the problems associated with prior bridge forming processes. By providing extra silicon over the diffusion regions, the process is more compatible with shallow junction technologies by improving the diffusion-silicide contact resistance. The process allows a thicker silicide to be formed for a given junction depth. At the same time, the extra silicon above the thin insulator gap insures that there will be adequate silicon available during the silicide reaction while also preventing additional silicon thickness that compensates for refractory metal thinning during the silicide sinter cycle. The invention avoids the use of extra masking steps or doped silicon layers that can alter the doping profiles of underlaying diffusion regions.

Several modifications can be made to the method of the invention as described above. While the invention has been described with reference to forming a bridge contact between a diffusion region and a poly-filled trench, the method can be used to form a selective bridge contact between any silicon regions separated by a thin insulator gap. While HCl was used as the etch/disassociation component of the selective silicon process, other halide gases providing similar properties (e.g. trichloroethane) could be used. While the silicon deposition was carried out at 880° C., this temperature may be reduced if the pressure could be reduced below 40 Torr (the present invention lacked the tooling to reduce the pressure below this value). The flow rates of the respective gases can be varied, so long as the general percentages are relatively constant. While titanium was used as the refractory metal, other refractory metals having low resistivity characteristics (e.g. tungsten, cobalt, etc.) could be used.

What is claimed is:

1. A process for forming a bridge contact between first silicon regions separated by a narrow insulator gap without forming a contact between second silicon regions separated by insulator gaps that are wider than the narrow insulator gap, comprising the steps of:

providing a substrate having a plurality of first and second exposed silicon regions on an exposed surface thereof separated by a plurality of insulator regions, said first regions being separated by narrow insulator gaps and said second regions being separated by other insulator gaps appreciably wider than said narrow insulator gaps, at least some of said first and second regions comprising shallow diffusion regions;

growing undoped silicon regions over said plurality of first and second regions by exposure to a deposition gas comprised of a silicon component and an etchant component, said silicon component and said etchant component being present at a ratio sufficient to allow said silicon to grow over said narrow insulator gaps without allowing said silicon to grow over said other insulator gaps, said undoped silicon regions being grown under conditions that do not appreciably vary dopant profiles of said shallow diffusion regions;

depositing a refractory metal on said substrate, said refractory meal being of a thickness commensurate with that of said grown silicon regions;

sintering said substrate to form silicide regions over said first and second regions as well as over said narrow insulator gaps without forming a silicide over said other insulator gaps; and removing unreacted portions of said refractory metal without appreciably etching said silicide regions.

2. The method as described in claim 1, wherein said ratio of said silicon component to said etchant component is at least approximately 0.7:1.

3. The method as recited in claim 2, wherein said ratio of said silicon component to said etchant component is between approximately 0.7:1 and 1.15:1.

4. The method as recited in claim 1, wherein said silicon component comprises chlorosilane.

5. The method as recited in claim 1, wherein said etchant component comprises a gas selected from the group consisting of TCA and HCl.

6. The method as recited in claim 3, wherein said silicon component comprises dichlorosilane and wherein said etchant component comprises HCl.

7. The method as recited in claim 1, wherein said step of growing said silicon regions is carried out at a temperature between 860° C.–925° C. and a pressure below 50 Torr.

8. The method as recited in claim 7, wherein said temperature comprises 880° C. and wherein said pressure comprises 40 Torr.

9. The method as recited in claim 1, wherein said refractory metal is selected from the group consisting of titanium, tungsten, and cobalt.

10. The method as recited in claim 9, wherein said refractory metal is deposited under conditions that promote formation of substantially columnar grains.

11. The method as recited in claim 10, wherein said refractory metal comprises titanium, and wherein said refractory metal is deposited by evaporation with the substrate at a temperature of approximately 390° C.

12. The method as recited in claim 1, wherein said step of sintering said substrate is carried out in a nitrogen-based gas comprised of approximately 90% N2 and approximately 10% H2.

13. A method for forming a bridge contact between silicon regions separated by a thin insulator gap, without coupling other silicon regions separated by insulator gaps appreciably greater than the thin insulator gap, comprising the steps of:
    forming a plurality of shallow diffusion regions and polycrystalline silicon regions on a monocrystalline silicon substrate, at least some of said shallow diffusion regions and polycrystalline silicon regions being separated by a thin insulator gap while others of said shallow diffusion regions and polycrystalline silicon regions being separated by other insulator gaps of a width substantially greater than said thin insulator gap;
    growing undoped silicon regions on said plurality of shallow diffusion regions and polycrystalline silicon regions and over said thin insulator gap without growing silicon over said thick insulator gap and without appreciably varying dopant profiles of said plurality of shallow diffusion regions, by exposure to a deposition gas comprising a silane-based gas and a halogen-based gas, said gases being present at a ratio between approximately 0.7:1 and 1.15:1;
    depositing a blanket layer of titanium of a thickness commensurate to that of said silicon regions on said substrate, said refractory metal layer being deposited under conditions that promote step coverage;
    heating the substrate in the presence of a nitrogen-based gas to form silicide regions over said silicon regions and over said thin insulator gap without forming a silicide region over said other insulator gaps; and
    removing unreacted portions of said refractory metal by exposure to an etchant that does not appreciably attack said silicide regions.

14. The method as recited in claim 13, wherein said silane-based gas comprises dichlorosilane.

15. The method as recited in claim 14, wherein said step of growing said silicon regions is carried out at a temperature between approximately 850° C. and 900° C.

16. The method as recited in claim 15, wherein said step of growing said silicon regions is carried out at a temperature of 880° C. and a pressure of approximately 40 Torr.

17. The method as recited in claim 13, wherein said halogen-based gas comprises HCl, and wherein said dichlorosilane gas and said HCl gas are present at a ratio of approximately 0.85:1, respectively.

* * * * *